United States Patent [19]

Kidouchi et al.

[11] Patent Number: 4,909,435

[45] Date of Patent: Mar. 20, 1990

[54] HOT WATER SUPPLY SYSTEM

[75] Inventors: Yasuo Kidouchi, Yamatokoriyama; Hiroaki Yonekubo, Kyoto, both of Japan

[73] Assignee: Matsushita Electric Industrial Co., Ltd., Osaka, Japan

[21] Appl. No.: 213,103

[22] Filed: Jun. 28, 1988

[30] Foreign Application Priority Data

Jun. 29, 1987 [JP] Japan .................................. 62-161759

[51] Int. Cl.$^4$ ............................................. G05D 23/00
[52] U.S. Cl. ................................ 236/12.12; 236/93 R; 4/192
[58] Field of Search .................. 236/12.1, 12.11, 46 R, 236/93 R, 93 B; 137/334, 337; 4/192

[56] References Cited

U.S. PATENT DOCUMENTS 4,563,780  1/1986  Pollack ..................................... 4/192
4,700,884  10/1987  Barrett et al. ...................... 236/12.12

FOREIGN PATENT DOCUMENTS 61-18424  2/1986  Japan .
0109108   5/1987  Japan .................................. 236/12.1

Primary Examiner—Harry B. Tanner
Attorney, Agent, or Firm—Lowe, Price, LeBlanc, Becker & Shur

[57] ABSTRACT

In a first hot water supply system, when water supply is required to be stopped, a temperature of supplied water is moved to a given temperature. The water supply is stopped after the temperature of the supplied water moves to the given temperature. In a hot water supply system according to another aspect of the invention, one of a plurality of outlets is selected and water is directed toward the selected outlet. When the selected outlet is required to be changed to another of the outlets, a temperature of the water is changed to a given temperature. The selected outlet is changed to another of the outlets after the water temperature changes to the given temperature.

18 Claims, 13 Drawing Sheets

HOT WATER SUPPLY SYSTEM

FIELD OF THE INVENTION

This invention relates to a system for supplying hot or warm water having an adjustable temperature.

BACKGROUND OF THE PRIOR ART

Japanese published unexamined utility model application 61-18424 discloses a temperature-adjustable hot water supply system used for only a single task or a few tasks. In this prior art system, during a time immediately after hot water was supplied, when warm water is required, hot water tends to be supplied initially.

SUMMARY OF THE INVENTION

It is an object of this invention to provide a safe hot water supply system.

It is another object of this invention to provide a hot water supply system which prevents the supply of hot water when warm water is required during a time immediately after hot water was supplied.

In a hot water supply system according to a preferred embodiment of this invention, when water supply is required to be stopped, a temperature of supplied water is moved to a given temperature. The water supply is stopped after the temperature of the supplied water moves to the given temperature.

In a hot water supply system according to another embodiment of this invention, one of a plurality outlets is selected and water is directed toward the selected outlet. When the selected outlet is required to be changed to another of the outlets, a temperature of the water is moved to a given temperature. The selected outlet is changed to another of the outlets after the water temperature moves to the given temperature.

DESCRIPTION OF THE FIRST PREFERRED EMBODIMENT

Figure 1:
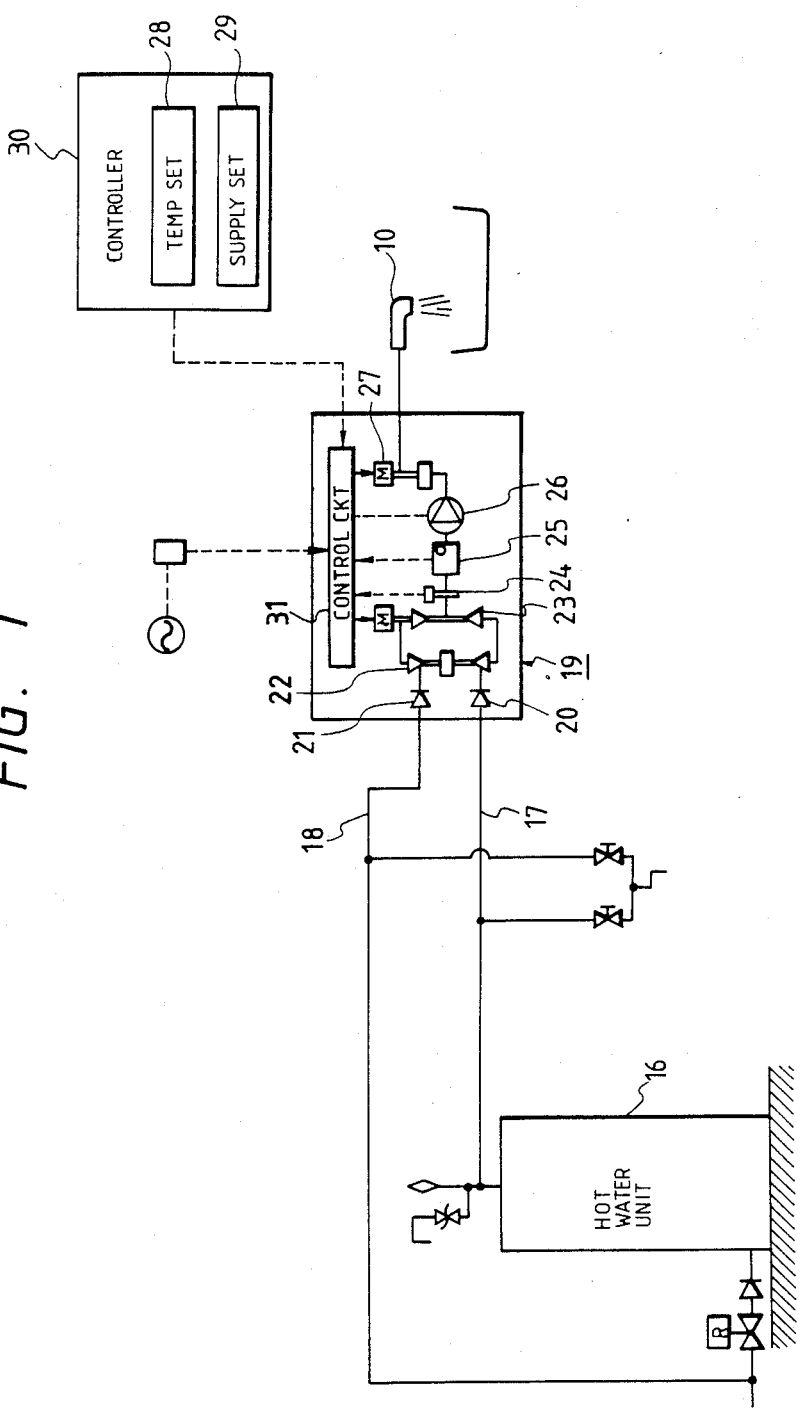
FIG. 1 is a diagram of a hot water supply system according to a first embodiment of this invention.

With reference to FIG. 1, a hot water supply system according to a first embodiment of this invention includes a hot water generating unit or a heater 16 producing hot water. The hot water is transmitted from the hot water generating unit 16 to a mixing unit 19 via a hot water passage 17. Cold water is transmitted to the mixing unit 19 via a cold water passage 18.

In the mixing unit 19, the incoming hot water travels to a mixing valve 23 via a check valve 20 and a pressure balancing valve 22. The incoming cold water travels to the mixing valve 23 via a check valve 21 and the pressure balancing valve 22. The pressure balancing valve 22 serves to balance the pressure of the hot water and the pressure of the cold water. The mixing valve 23 serves to mix the hot water and the cold water at an adjustable ratio. The mixing valve 23 is preferably of a motor-driven type, being controlled via an electric signal. The ratio between the hot water and the cold water in the resultant water mixture is adjusted in accordance with the electric signal applied to the mixing valve 23. The water mixture moves from the mixing valve 23 to a control valve 27 via a thermistor 24, a flow rate sensor 25, and a pressurizing pump 26. When the control valve 27 is open, the water mixture is allowed to travel to a nozzle 10. In this case, the water mixture is injected via the nozzle 10. The control valve 27 has a function of continuously varying the flow rate of the water mixture. When the control valve 27 is closed, the travel of the water mixture to the nozzle 10 is inhibited. In this case, the injection of the water mixture via the nozzle 10 is interrupted. The control valve 27 is preferably of a motor-driven type, being controlled via an electric signal. The rate of flow of the water mixture through the control valve 27 is adjusted in accordance with the electric signal applied to the control valve 27.

A manually-operable controller 30 includes a temperature setting section 28 and a supply setting section 29. The setting sections 28 and 29 output control signals to a control circuit 31 within the mixing unit 19. The temperature of the water mixture injected via the nozzle 10 is adjusted by operating the temperature setting section 28. The injection of the water mixture via the nozzle 10 is allowed or inhibited by operating the supply setting section 29. In addition, the rate of injection of the water mixture via the nozzle 10 is adjusted by operating the supply setting section 29.

Figure 2:
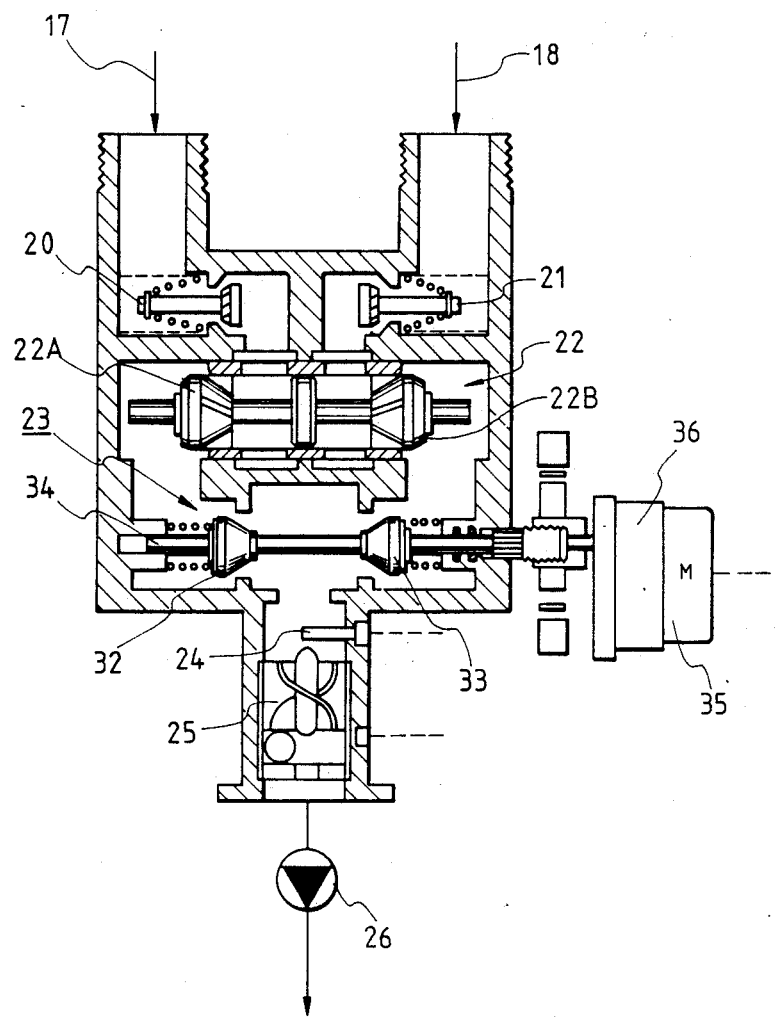
FIG. 2 is a sectional view of a portion of the hot water supply system of FIG. 1 which includes the check valves, the pressure balancing valve, and the mixing valve.

As shown in FIG. 2, the hot water moves from the hot water passage 17 into the pressure balancing valve 22 via the check valve 20. The cold water moves from the cold water passage 18 into the pressure balancing valve 22 via the check valve 21. The pressure balancing valve 22 includes a slidable piston provided with a hot water valve member 22A and a cold water valve member 22B. The valve members 22A and 22B move in accordance with a pressure differential between the hot water and the cold water to balance the pressures of the hot water and the cold water. Twisted blades formed on the valve members 22A and 22B allow the valve members 22A and 22B to be rotated by the flows of the hot water and the cold water. The rotation of the valve members 22A and 22B prevents calcium components in the water from depositing on the valve members 22A and 22B.

After the hot water and the cold water pass through the pressure balancing valve 22, they enter the mixing valve 23 and mix therein to form a mixture of the hot water and the cold water. The mixing ratio between the hot water and the cold water can be controlled via an electric signal applied to the mixing valve 23. The mixing valve 23 includes a hot water valve member 32 and a cold water valve member 33 mounted on a common shaft 34. The mixing ratio between the hot water and the cold water depends on the positions of the valve members 32 and 33. The shaft 34 is coupled to a motor 35 via a gear box 36. The valve members 32 and 33 can be driven by the motor 35. The valve members 32 and 33 taper and oppose each other. The axes of the taper valve members 32 and 33 extend along the directions of the flows of the hot water and the cold water. This arrangement of the valve members 32 and 33 facilitates the mixing of the hot water and the cold water and also allows the mixing ratio between the hot water and the cold water to vary linearly with the displacement of the valve members 32 and 33.

The temperature of the resulting water mixture is monitored via the thermistor 24. A feedback control loop including the control circuit 31 (see FIG. 1) adjusts the motor 35 in accordance with the difference between a target temperature and the monitored temperature of the water mixture so that the actual temperature of the water mixture can be regulated at the target temperature.

The flow rate of the water mixture is detected by the flow rate sensor 25. An output signal from the flow rate sensor 25 is used in flow rate control. In addition, the output signal from the flow rate sensor 25 is used in stopping of the motor 35 when the hot water supply is at rest. As will be made clear hereinafter, this action prevents the supply of excessively hot water upon a restart of the hot water supply.

If the motor 35 is energized during the suspension of the hot water supply, the following phenomenon could occur. During a time immediately after the hot water supply, when the hot water supply is restarted, water having a temperature higher than a target temperature tends to be supplied initially. This is because the temperature of the thermistor 24 drops naturally after the suspension of the hot water supply, and this drop in the temperature of the thermistor 24 causes the mixing valve 23 to move toward a hotter side upon the restart of the hot water supply.

Figure 3:
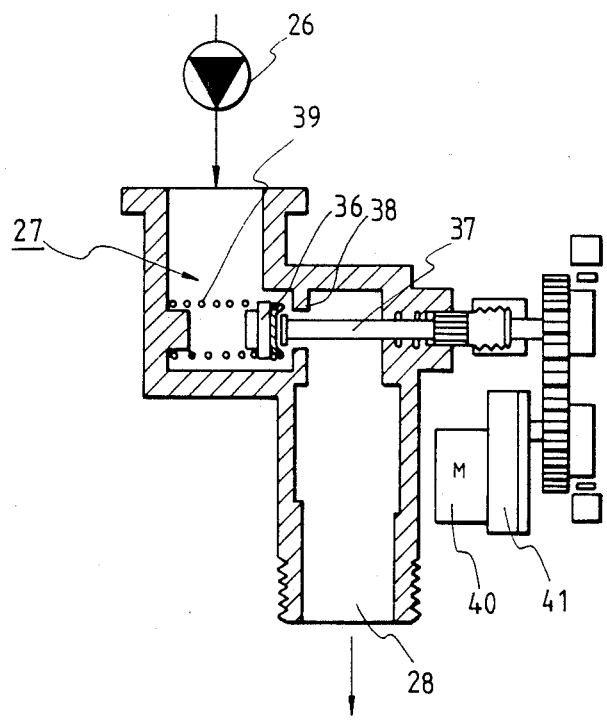
FIG. 3 is a sectional view of another portion of the hot water supply system of FIG. 1 which includes the control valve.

As shown in FIG. 3, the water mixture is driven by the pressurizing pump 26 into the control valve 27. The control valve 27 includes a valve member 36 engageable with a valve seat 38. A spring 39 urges the valve member 36 toward the valve seat 38. When the valve member 36 contacts the valve seat 38, the flow of the water mixture through the control valve 27 is blocked. When the valve member 36 separates from the valve seat 38, the water mixture is allowed to pass through the control valve 27. The rate of flow of the water mixture through the control valve 27 depends on the position of the valve member 36 relative to the position of the valve seat 38. The valve member 36 is mounted on a shaft 37 which is coupled to a motor 40 via a gear box 41. The valve member 36 can be driven by the motor 40.

Figure 4:
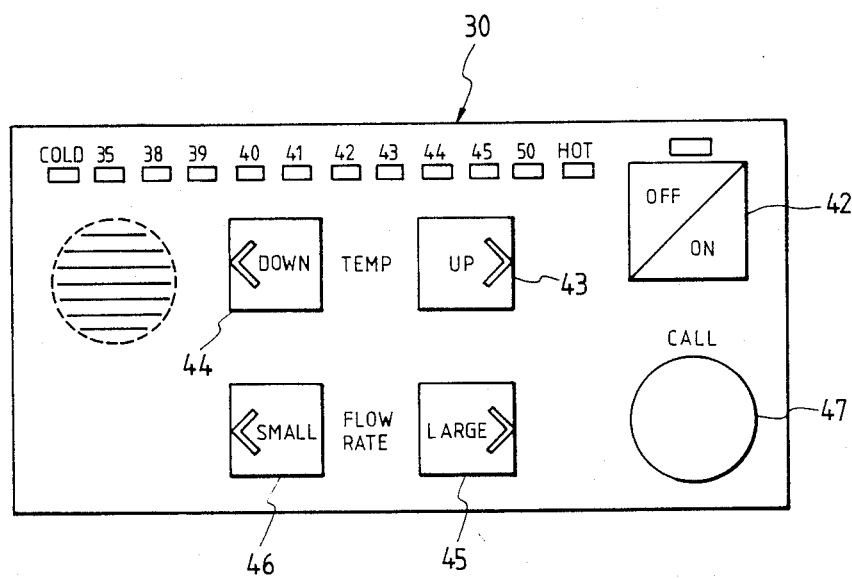
FIG. 4 is a front view of the controller of FIG. 1.

As shown in FIG. 4, the controller 30 includes a supply ON-OFF switch 42 and flow rate increasing and decreasing switches 45 and 46 which form the supply setting section 29 (see FIG. 1). The supply switch 42 moves between an ON position and an OFF position each time it is actuated or depressed. When the supply switch 42 is depressed for the first time and it is moved to its ON position, the control valve 27 (see FIG. 1) is opened so that water is supplied via the nozzle 10 (see FIG. 1). The supply rate of the water is increased by actuating the flow rate increasing switch 45. The supply rate of the water is decreased by actuating the flow rate decreasing switch 46. When the supply switch 42 is depressed again and it is moved to its OFF position, the control valve 27 is closed so that the supply of the water via the nozzle 10 is interrupted.

The controller 30 also includes temperature up and down switches 43 and 44 forming the temperature setting section 28 (see FIG. 1). At a start of the supply of the water via the nozzle 10, the temperature of the water is adjusted to a preset temperature. During the supply of the water, the temperature of the water is increased and decreased from the preset temperature by actuating the temperature up switch 43 and the temperature down switch 44 respectively.

The controller 30 further includes a call switch 57 which allows the generation of a call when actuated.

Figure 5:
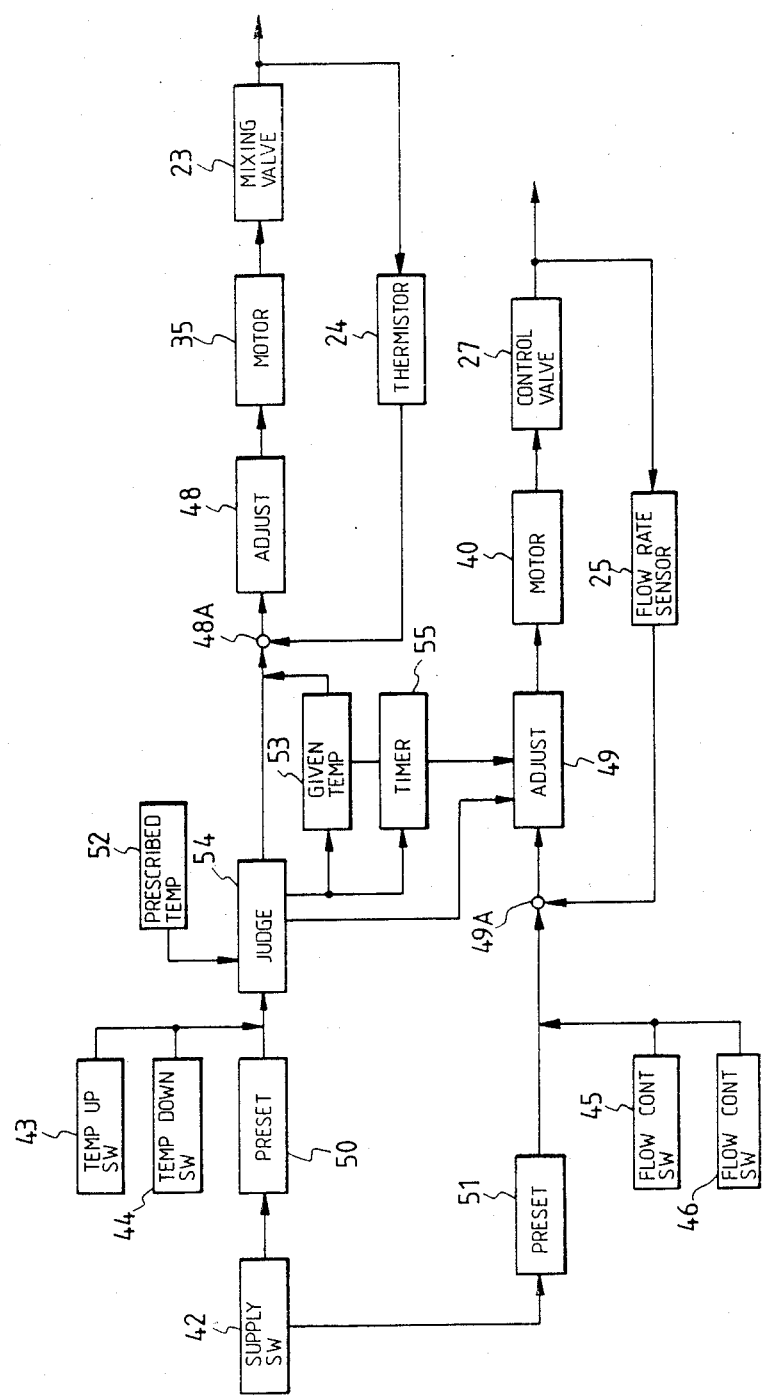
FIG. 5 is a block diagram of the hot water supply system of FIG. 1.

As shown in FIG. 5, the mixing valve 23, the thermistor 24, a subtracter 48A, an adjustment section 48, and the motor 35 form a feedback control loop. The adjustment section 48 may include a servo amplifier or a driver for the motor 43. The subtracter 48A derives a difference between a target water temperature and the actual water temperature detected via the thermistor 24. The mixing valve 23 is controlled via the motor 35 in accordance with the difference between the actual water temperature and the target water temperature so that the actual water temperature can be regulated at the target water temperature. The target water temperature is basically determined via signals outputted from the previously-mentioned various switches and variable resistors. At a start of the water supply in response to the depression of the supply switch 42 into its ON position, the target water temperature is set to a predetermined temperature given by a preset section 50. The preset section 50 is preferably composed of an adjustable voltage generator including a variable resistor. During the water supply, the target water temperature can be varied by actuating the temperature control switches 43 and 44. The subtracter 48A is subjected to a signal representative of the target water temperature which depends on the output signals from the temperature control switches 43 and 44.

The control valve 27, the flow rate sensor 25, a subtracter 49A, an adjustment section 49, and the motor 40 form a feedback control loop. The adjustment section 49 may include a servo amplifier or a driver for the motor 40. The subtracter 49A derives a difference between a target water flow rate and the actual water flow rate detected via the flow rate sensor 25. The control valve 27 is adjusted via the motor 40 in accordance with the difference between the actual water flow rate and the target water flow rate so that the actual water flow rate can be regulated at the target water flow rate. At a start of the water supply in response to the depression of the supply switch 42 into its ON position, the target water flow rate is set to a predetermined flow rate given by a preset section 51. The preset section 51 is preferably composed of an adjustable voltage generator including a variable resistor. During the water supply, the actual water flow rate can be varied by actuating the flow rate control switches 45 and 46. The flow rate control switches 45 and 46 output control signals which vary a signal representing the target water flow rate and being applied to the subtracter 49A.

When the supply switch 42 is depressed for the first time and it is moved to its ON position, the preset section 51 is activated so that the preset section 51 outputs an initial target flow rate signal to the subtracter 49A. Accordingly, the control valve 27 is moved to an open position corresponding to the initial target flow rate so that the water supply is started at the initial target flow rate. In addition, the depression of the supply switch 42 into its ON position activates the preset section 50 so that the preset section 50 outputs an initial target temperature signal to the subtracter 48A via a judgment section 54. Accordingly, the mixing valve 23 is moved to a position corresponding to the initial target temperature so that the temperature of the supplied water is regulated at the initial target temperature. When the supply switch 42 is depressed again and it is moved to its OFF position, the control valve 27 is closed so that the water supply is interrupted.

The interruption of the water supply will be described in more detail. A prescribed temperature section 52 generates a prescribed temperature signal representative of a preset range of temperatures, for example, 38–45° C., which is applied to the judgment section 54. The judgment section 54 is preferably composed of a comparator. The judgment section 54 compares the current target temperature signal and the prescribed temperature signal to determine whether or not the current target temperature resides within the prescribed temperature range. In cases where the target temperature resides outside the prescribed temperature range, when the supply switch 42 is depressed again so that it is moved to its OFF position, the judgment section 54 activates a given temperature section 53 and a timer 55. After the supply switch 42 is moved to its OFF position, the timer 55 keeps the adjustment section 49 activated for a predetermined interval so that the water supply continues for that interval. During this additional water supply, the given temperature section 53 outputs a signal representative of a given target temperature, for example, 40° C., to the subtracter 48A so that the feedback temperature control moves the temperature of the supplied water to the given target temperature. The interval determined by the timer 55 is chosen to be a time in which the supplied water temperature surely moves to the given target temperature. Accordingly, after the supplied water temperature moves to the given target temperature, the water supply is suspended. This process prevents the supply of excessively hot or cold water upon a restart of water supply. In cases where the target temperature resides within the prescribed temperature range, when the supply switch 42 is moved to its OFF position, the judgment section 54 deactivates the adjustment section 49 and thus the control valve 27 is closed so that the water supply is interrupted immediately.

DESCRIPTION OF THE SECOND PREFERRED EMBODIMENT

Figure 6:
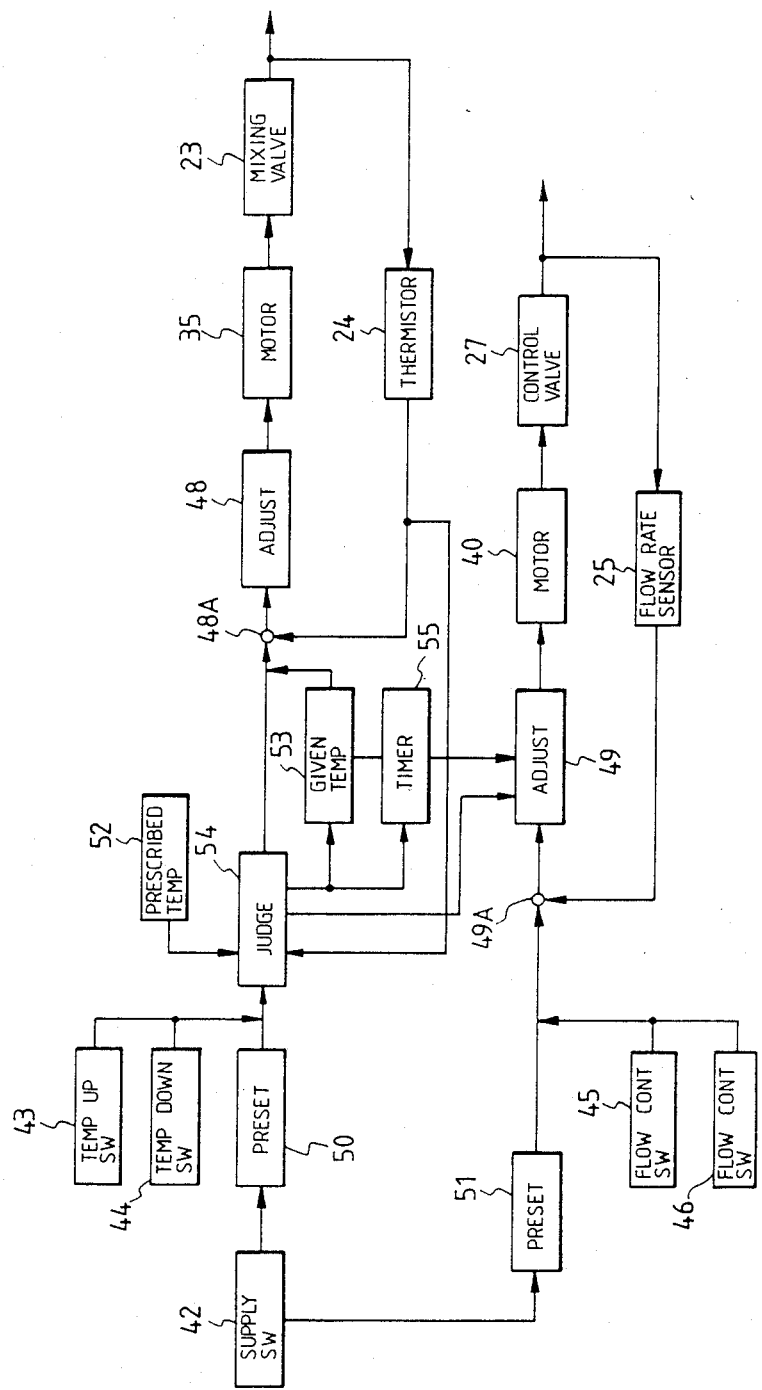
FIG. 6 is a block diagram of a hot water supply system according to a second embodiment of this invention.

FIG. 6 shows a second embodiment of this invention which is similar to the embodiment of FIGS. 1–5 except that the judgment section 54 compares the prescribed temperature signal and the actual temperature signal in place of the target temperature signal, the actual temperature signal being fed from the thermistor 24.

DESCRIPTION OF THE THIRD PREFERRED EMBODIMENT

Figure 7:
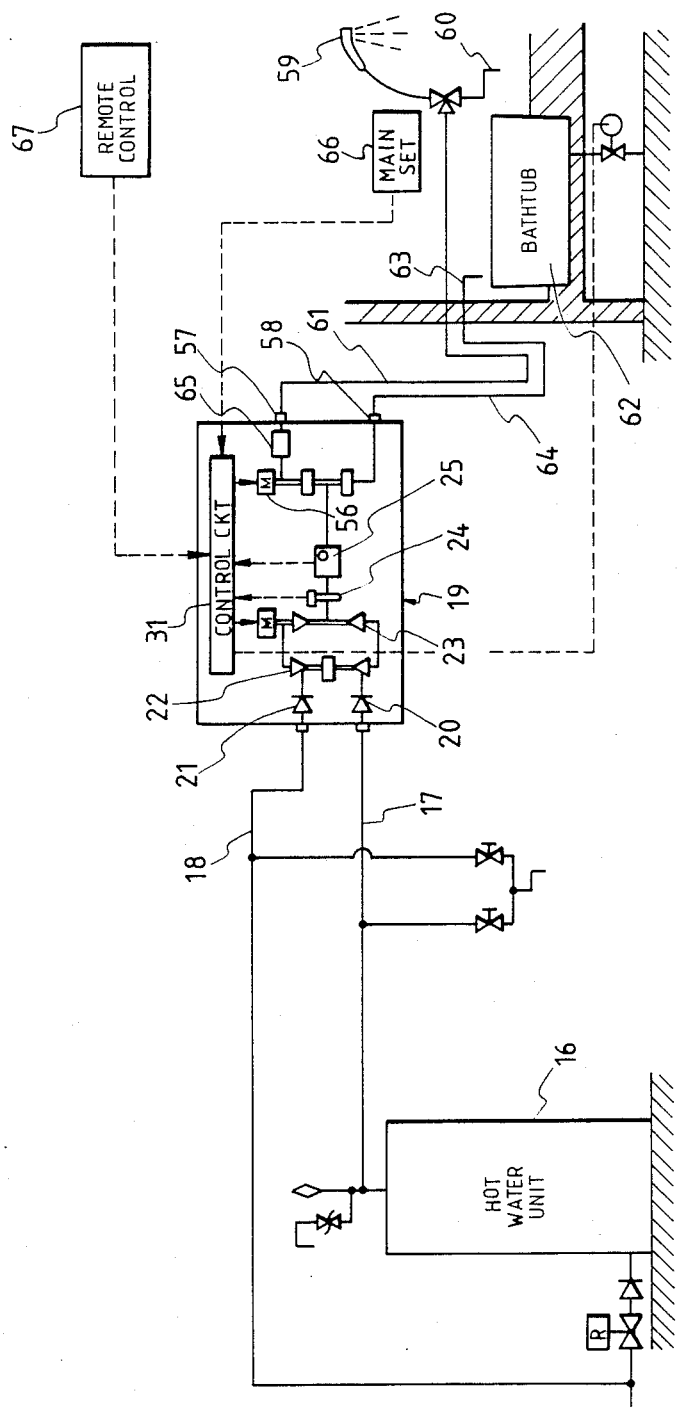
FIG. 7 is a diagram of a hot water supply system according to a third embodiment of this invention.

With reference to FIG. 7, a hot water supply system according to a third embodiment of this invention includes a hot water generating unit or a heater 16 producing hot water. The hot water is transmitted from the hot water generating unit 16 to a mixing unit 19 via a hot water passage 17. Cold water is transmitted to the mixing unit 19 via a cold water passage 18.

In the mixing unit 19, the incoming hot water travels to a mixing valve 23 via a check valve 20 and a pressure balancing valve 22. The incoming cold water travels to the mixing valve 23 via a check valve 21 and the pressure balancing valve 22. The pressure balancing valve 22 serves to balance the pressure of the hot water and the pressure of the cold water. The mixing valve 23 serves to mix the hot water and the cold water at an adjustable ratio. The mixing valve 23 is preferably of a motor-driven type, being controlled via an electric signal. The ratio between the hot water and the cold water in the resultant water mixture is adjusted in accordance with the electric signal applied to the mixing valve 23. The water mixture moves from the mixing valve 23 to a change-over valve 56 via a thermistor 24 and a flow rate sensor 25. The change-over valve 56 selectively directs the water mixture toward a first outlet 57 and a second outlet 58 of the mixing unit 19. The change-over valve 56 has an additional function of continuously varying the flow rate of the water mixture. The change-over valve 56 is preferably of a motor-driven type, being controlled via an electric signal.

The first outlet 57 of the mixing unit 19 is connected to a shower nozzle 59 and a faucet or tap 60 via a passage 61. The first outlet 57 of the mixing unit 19 is used in the supply of water having a temperature up to a predetermined limited point, for example, about 45° C. significantly lower than the highest temperature. The second outlet 58 of the mixing unit 19 is connected via a passage 64 to a nozzle 63 directed toward a bathtub 62. The second outlet 58 of the mixing unit 19 is used in the supply of water having a temperature up to the highest point.

The mixing unit 19 also includes a temperature safety valve 65 disposed between the change-over valve 56 and the first outlet 57. In cases where the mixing valve 23, the change-over valve 56, or a control circuit 31 described hereinafter malfunctions, the temperature safety valve 65 prevents the supply of excessively hot water to the shower nozzle 59 and the tap 60. The temperature safety valve 65 is preferably of a mechanical type, having a valve member driven by a temperature-responsive element.

A manually-controllable main setting unit 66 outputs control signals to the control circuit 31 within the mixing unit 19. Activated or selected one of the first and second outlets 57 and 58 can be changed by operating the main setting unit 66. In addition, the temperature of outgoing water can be varied by operating the main setting unit 66.

A remote control setting unit 67 also outputs control signals to the control circuit 31 within the mixing unit 19. The supply of hot water can be subjected to remote control by operating the remote control setting unit 67. The hot water supply can be started at an adjustable moment by operating a timer within the remote control setting unit 67. The remote control setting unit 67 allows the start of the hot water supply to be controlled via a telephone.

Figure 8:
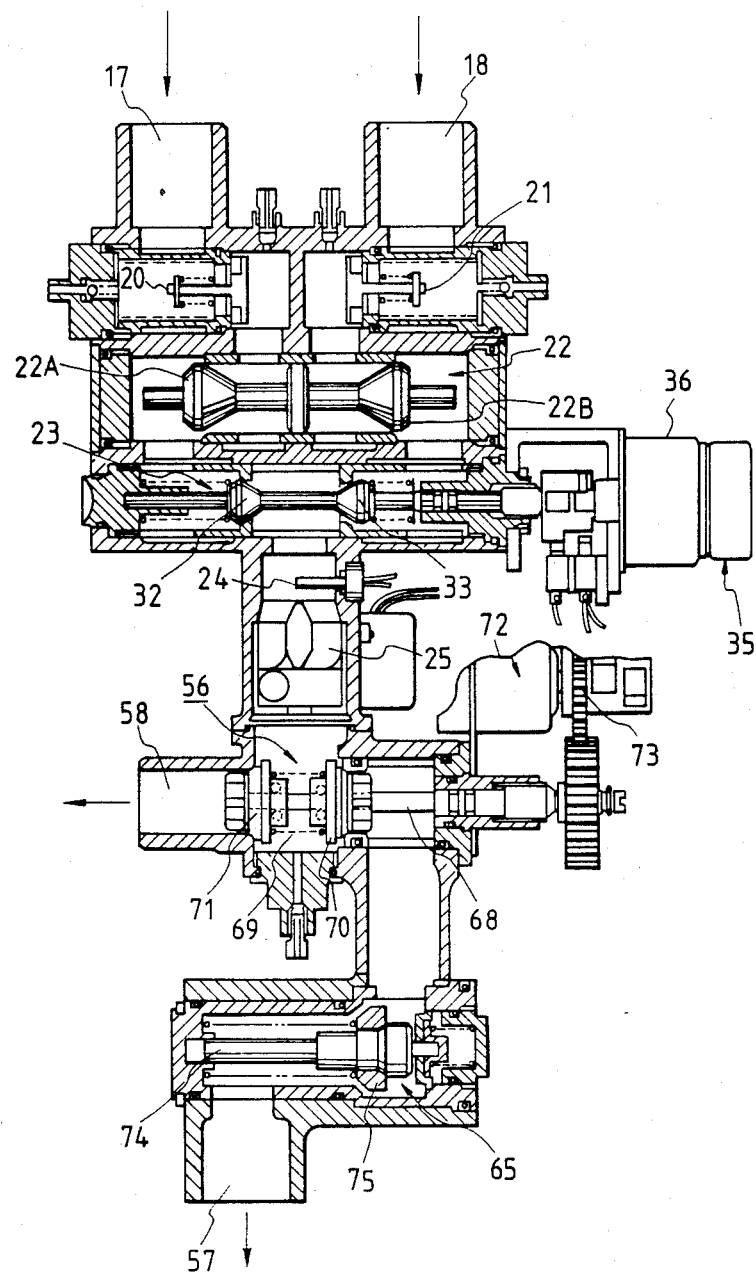
FIG. 8 is a sectional view of a portion of the hot water supply system of FIG. 7 which includes the check valves, the pressure balancing valve, the mixing valve, the change-over valve, and the temperature safety valve.

As shown in FIG. 8, the hot water moves from the hot water passage 17 into the pressure balancing valve 22 via the check valve 20. The cold water moves from the cold water passage 18 into the pressure balancing valve 22 via the check valve 21. The pressure balancing valve 22 includes a slidable piston provided with a hot water valve member 22A and a cold water valve member 22B. The valve members 22A and 22B move in accordance with a pressure differential between the hot water and the cold water to balance the pressures of the hot water and the cold water. Twisted blades formed on the valve members 22A and 22B allow the valve members 22A and 22B to be rotated by the flows of the hot water and the cold water. The rotation of the valve members 22A and 22B prevents calcium components in the water from depositing on the valve members 22A and 22B.

After the hot water and the cold water pass through the pressure balancing valve 22, they enter the mixing valve 23 and mix therein to form a mixture of the hot water and the cold water. The mixing ratio between the hot water and the cold water can be controlled via an electric signal applied to the mixing valve 23. The mixing valve 23 includes a hot water valve member 32 and a cold water valve member 33 mounted on a common shaft 34. The mixing ratio between the hot water and the cold water depends on the positions of the valve members 32 and 33. The shaft 34 is coupled to a motor 35 via a gear box 36. The valve members 32 and 33 can be driven by the motor 35. The valve members 32 and 33 taper and oppose each other. The axes of the tapered valve members 32 and 33 extend along the directions of the flows of the hot water and the cold water. This arrangement of the valve members 32 and 33 facilitates the mixing of the hot water and the cold water and also allows the mixing ratio between the hot water and the cold water to vary linearly with the displacement of the valve members 32 and 33.

The temperature of the resulting water mixture is monitored via the thermistor 24. A feedback control loop including the control circuit 31 (see FIG. 7) adjusts the motor 35 in accordance with the difference between a target temperature and the monitored temperature of the water mixture so that the actual temperature of the water mixture can be regulated at the target temperature.

The flow rate of the water mixture is detected by the flow rate sensor 25. An output signal from the flow rate sensor 25 is used in flow rate control and flow rate integration control. In addition, the output signal from the flow rate sensor 25 is used in stopping of the motor 35 when the hot water supply is at rest. As will be made clear hereinafter, this action prevents the supply of excessively hot water upon a restart of the hot water supply.

If the motor 35 is energized during the suspension of the hot water supply, the following phenomenon could occur. During a time immediately after the hot water supply, when the hot water supply is restarted, water having a temperature higher than a target temperature tends to be supplied initially. This is because the temperature of the thermistor 24 drops naturally after the suspension of the hot water supply, and this drop in the temperature of the thermistor 24 causes the mixing valve 23 to move toward a hotter side upon the restart of the hot water supply.

After the water mixture passes through the flow rate sensor 25, it enters the change-over valve 56. The change-over valve 56 includes valve members 70 and 71 mounted on a movable shaft 68 and urged by a spring 69. The shaft 68 is coupled to a motor 72 via a gear box 73. The valve members 70 and 71 are driven by the motor 72. When the shaft 68 is in its neutral position, the supply of the water mixture to the first and second outlets 57 and 58 is inhibited. As the shaft 68 is moved leftward from the neutral position as viewed in FIG. 8, the water mixture is directed toward the first outlet 57 and the flow rate of the water mixture increases. As the shaft 68 is moved rightward from the neutral position as viewed in FIG. 8, the water mixture is directed toward the second outlet 58 and the flow rate of the water mixture increases. The valve members 70 and 71 can slide relative to the shaft 68. An 0-ring extends between the valve member 70 and the shaft 68. Another 0-ring extends between the valve member 71 and the shaft 68. Outward displacements of the valve members 70 and 71 are limited by stoppers fixed to the shaft 68. The spring 69 urges the valve members 70 and 71 toward the stoppers. The valve members 70 and 71 have respective packings engageable with valve seats. When the shaft 68 is in its neutral position, the packings of the valve members 70 and 71 are in contact with the respective valve seats so that both of water passages toward the outlets 57 and 58 are blocked. When the shaft 68 moves leftward from the neutral position, the packing of the valve member 71 remains in contact with the associated valve seat but the packing of the valve member 70 separates from the associated valve seat so that the water passage toward the outlet 57 is unblocked. When the shaft 68 moves rightward from the neutral position, the packing of the valve member 70 remains in contact with the associated valve seat but the packing of the valve member 71 separates from the associated valve seat so that the water passage toward the outlet 58 is unblocked.

The temperature safety valve 65 includes a temperature responsive element 74 and a valve member 75 connected to the temperature responsive element 74. The temperature responsive element 74 has thermo-wax. The temperature responsive element 74 is disposed within a water passage extending between the change-over valve 56 and the outlet 57 so as to respond to the temperature of water in the passage. When the temperature of the temperature responsive element 74, that is, the temperature of the water in that passage, exceeds a preset point, for example, 46° C., the temperature responsive element 74 expands and thereby moves the valve member 75 into a position where the water passage is blocked.

Figure 9:
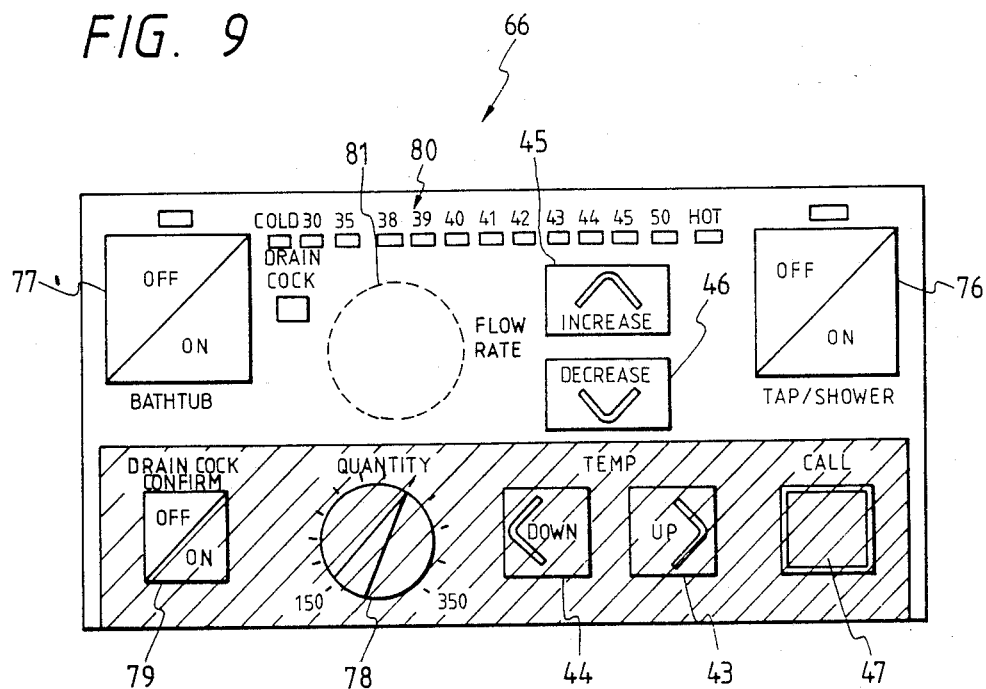
FIG. 9 is a front view of the main setting unit of FIG. 7.

As shown in FIG. 9, the main setting unit 66 includes a tap/shower ON-OFF switch 76, a bathtub ON-OFF switch 77, and flow rate increasing and decreasing switches 45 and 46. Buttons of the respective switches 76, 77, 45, and 46 are exposed from a front panel of the main setting unit 66. The tap/shower switch 76 changes between an ON position and an OFF position each time it is actuated or depressed. The bathtub switch 77 is of the type similar to that of the tap/shower switch 76. When the tap/shower switch 76 is depressed into its ON position, the first outlet 57 of the mixing unit 19 is selected via the change-over valve 56 so that the water mixture is supplied to the tap 60 and the shower nozzle 59. When the bathtub switch 77 is depressed into its ON position, the second outlet 58 of the mixing unit 19 is selected via the change-over valve 56 so that the water mixture is supplied to the bathtub nozzle 63. In both of these cases, the temperature of the supplied water mixture is regulated at a target temperature variably determined via variable resistors. The supply rate of the water mixture is increased by actuating the flow rate increasing switch 45. The supply rate of the water mixture is decreased by actuating the flow rate decreasing switch 46.

The main setting unit 66 includes a call switch 47 which allows the generation of a call when actuated.

A variable resistor 78 has a control knob normally covered by a movable lid attached to the front panel of the main setting unit 66. The variable resistor 78 is used in setting a desired total quantity of supplied water. When the actual quantity of supplied water reaches the desired total quantity, the water supply is automatically suspended.

Temperature up and down switches 43 and 44 have buttons normally covered by the lid on the front panel of the main setting unit 66. The target temperature of the supplied water mixture is increased by actuating the temperature up switch 43. The target temperature of the supplied water mixture is decreased by actuating the temperature down switch 44.

The main setting unit 38 includes a drain cock confirmation switch 79 used in opening and closing a drain cock of the bathtub 62. The switch 79 is also used in receiving a signal from the remote control setting unit 67. The main setting unit 66 further includes a display 80 and a warning buzzer 81.

The target temperature of the supplied water can be varied via the temperature up switch 43 within a range which depends on which of the outlets 57 and 58 is selected via the tap/shower switch 76 and the bathtub switch 77. When the first outlet 57 is selected by depressing the tap/shower switch 76 into its ON position, the target temperature of the supplied water can be varied within a limited range up to 45° C. When the second outlet 58 is selected by depressing the bathtub switch 77 into its ON position, the target temperature of the supplied water can be varied within a full range up to the highest temperature.

Figure 10:
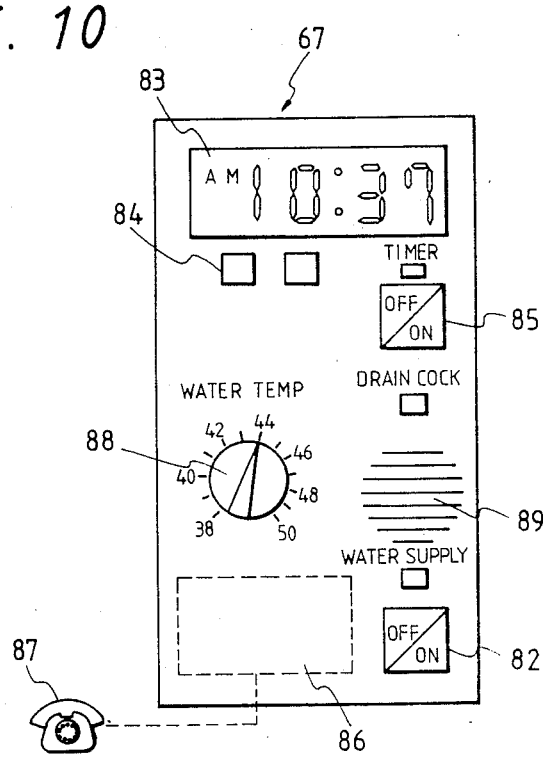
FIG. 10 is a front view of the remote control setting unit of FIG. 7.

As shown in FIG. 10, the remote control setting unit 67 includes a remote control switch 82. In cases where the drain cock confirmation switch 79 (see FIG. 9) is depressed and the water mixture supply via the actuation of the main setting unit 66 is at rest, when the remote control switch 82 is depressed, water mixture supply is performed.

The remote control setting unit 67 includes a combination of an indicator 83, a timer 84, and a timer switch 85. In cases where the drain cock confirmation switch 79 (see FIG. 9) is depressed and the water mixture supply via the actuation of the main setting unit 66 is at rest and where the timer switch 85 is depressed, water mixture supply can be started at a moment adjustably determined via the timer 84.

The remote control setting unit 67 is provided with an HA adapter 86 which allows mixture water supply to be started by an instruction transmitted via a telephone 87. This mixture water supply is enabled provided that the drain cock confirmation switch 79 (see FIG. 9) is depressed and that the water mixture supply via the actuation of the main setting unit 66 is at rest.

During the mixture water supply via the actuation of the remote control setting unit 67, the temperature of the supplied water mixture is regulated at a target temperature adjustably determined via a variable resistor 88 in the remote control setting unit 67. When the target temperature of the supplied water mixture is moved into a preset higher range via the actuation of the variable resistor 88, the second outlet 58 (see FIG. 7) of the mixing unit 19 is automatically selected so that the water mixture is supplied to the bathtub 62.

The remote control setting unit 67 includes a buzzer 89 and various indicators. The buzzer 89 is activated when the call switch 47 (see FIG. 9) is depressed.

Figure 11:
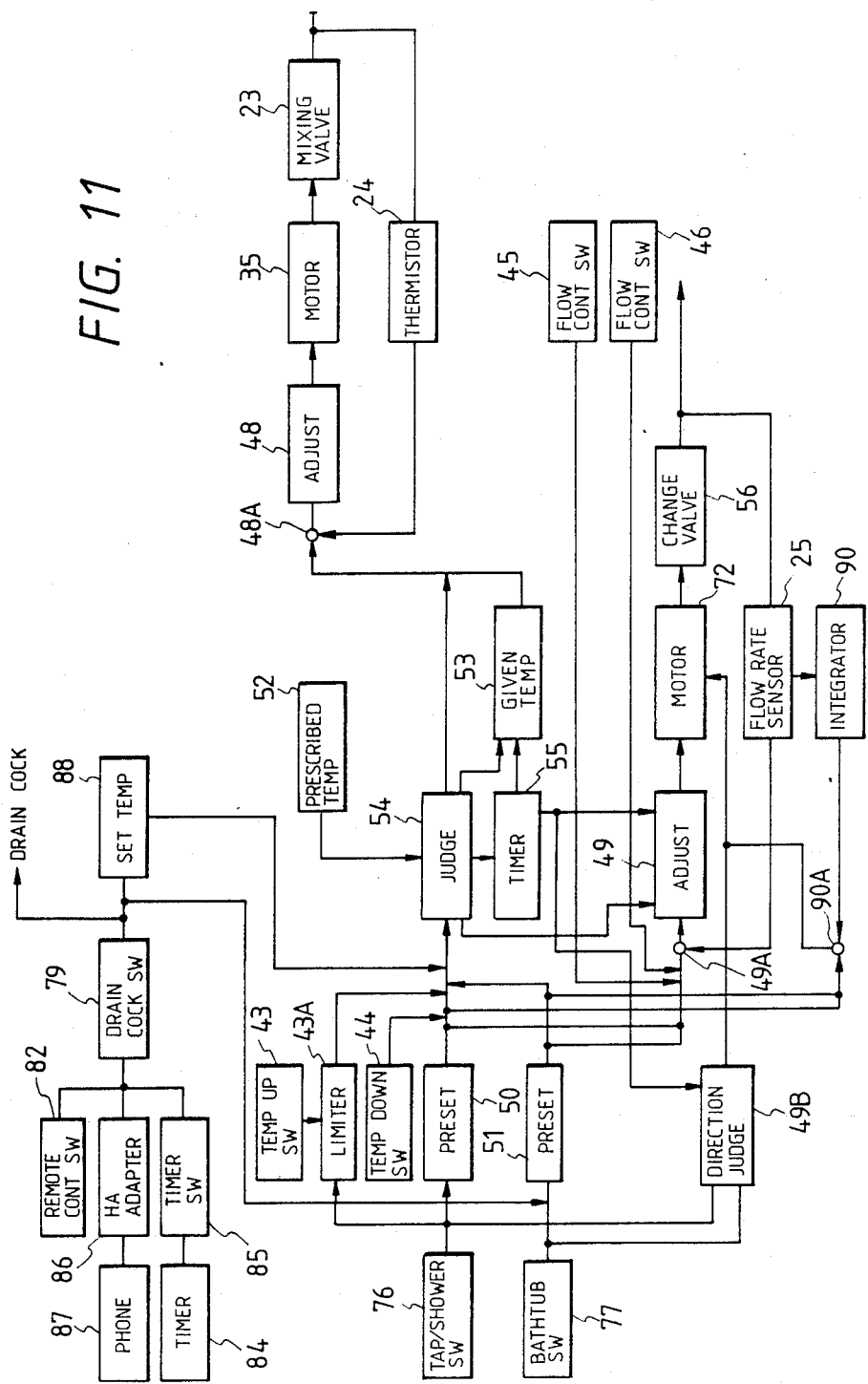
FIG. 11 is a block diagram of the hot water supply system of FIG. 7.

As shown in FIG. 11, the mixing valve 23, the thermistor 24, a subtracter 48A, an adjustment section 48, and the motor 35 form a feedback control loop. The adjustment section 48 may include a servo amplifier or a driver for the motor 35. The subtracter 48A derives a difference between a target water temperature and the actual water temperature detected via the thermistor 24. The mixing valve 23 is controlled via the motor 35 in accordance with the difference between the actual water temperature and the target water temperature so that the actual water temperature can be regulated at the target water temperature. The target water temperature is determined via signals outputted from the previously-mentioned various switches and variable resistors.

At a start of the water supply in response to the depression of the tap/shower switch 76 into its ON position, the target water temperature is set to a first predetermined temperature given by a preset section 50. The preset section 50 is preferably composed of adjustable voltage generators including variable resistors. At a start of the water supply in response to the depression of the bathtub switch 77 into its ON position, the target water temperature is set to a second predetermined temperature given by a preset section 51 and being higher than the first predetermined temperature. The preset section 51 is preferably composed of adjustable voltage generators including variable resistors.

During the water supply, the target water temperature can be varied by actuating the temperature control switches 43 and 44. The subtracter 48A is subjected to a signal representative of the target water temperature which depends on the outputs signals from the temperature control switches 43 and 44. A limiter 43A interposed between the temperature up switch 43 and the subtracter 48A is activated in response to the depression of the tap/shower switch 76 into is ON position. When the tap/shower switch 76 is depressed into its ON position, the limiter 43A controls the output signal from the temperature up switch 43 so that the target water temperature can be limited to within a preset range significantly lower than the highest temperature. When the bathtub switch 77 is depressed into its ON position, the limiter 43A is disabled so that the output signal from the temperature up switch 43 travels to the subtracter 48A without undergoing the limiting process. In this case, the target temperature can vary up to the highest temperature. Accordingly, the limiter 43A changes a variable range of the target temperature in accordance with which of the tap/shower switch 76 and the bathtub switch 77 is selected, that is, which of the outlets 57 and 58 (see FIG. 7) of the mixing unit 19 is selected.

The change-over valve 56 selects one of the first and second outlets 57 and 58 of the mixing unit 19 in accordance with an instruction transmitted from the tap/shower switch 76 or the bathtub switch 77 via a direction judgment section 49B and the motor 72. The change-over valve 56, the flow rate sensor 25, a subtracter 49A, an adjustment section 49, and the motor 72 form a feedback control loop. The adjustment section 49 may include a servo amplifier or a driver for the motor 72. The subtracter 49A derives a difference between a target water flow rate and the actual water flow rate detected via the flow rate sensor 25. The change-over valve 56 is controlled via the motor 72 in accordance with the difference between the actual water flow rate and the target water flow rate so that the actual water flow rate can be regulated at the target water flow rate.

At a start of the water supply in response to the depression of the tap/shower switch 76 into its ON position, the target water flow rate is set to a first predetermined flow rate given by the preset section 50. At a start of the water supply in response to the depression of the bathtub switch 77 into its ON position, the target water flow rate is set to a second predetermined flow rate given by the preset section 51. During the water supply, the actual water flow rate can be varied by actuating the flow rate control switches 45 and 46. The flow rate control switches 45 and 46 output control signals which vary a signal representing the target water flow rate and being applied to the subtracter 49A.

A flow rate integrator 90 accumulates the output signal from the flow rate sensor 25 and thereby generates a signal representing the actual quantity of the supplied water. A comparator 90A receives the output signal from the flow rate integrator 90 and a signal representative of a desired total quantity of supplied water which is adjustably determined via the variable resistor 78 (see FIG. 9). The variable resistor 78 is preferably disposed within the preset section 51. When the actual quantity of the supplied water reaches the desired quantity of the supplied water, the comparator 90A outputs a control signal to the motor 72 which forces the change-over valve 56 to suspend further supply of the water mixture.

The tap/shower switch 76 and the bathtub switch 77 are connected to the motor 72 via the judgment section 49B. The judgment section 49B determines a target direction of displacement of the change-over valve 56 in accordance with the output signals from the tap/shower switch 76 and the bathtub switch 77. When the tap/shower switch 76 is depressed into its ON position, the judgment section 49B drives the motor 72 so that the change-over valve 56 can select the first outlet 57 of the mixing unit 19. When the bathtub switch 77 is depressed into its ON position, the judgment section 49B drives the motor 72 so that the change-over valve 56 can select the second outlet 58 of the mixing unit 19.

A judgment section 54 preferably composed of a comparator is disposed between the subtracter 48A and the devices 43A, 44, and 50. A prescribed temperature section 52 generates a prescribed temperature signal representative of a preset range of temperatures, for example, 38°-45° C., which is applied to the judgment section 54. The judgment section 54 compares the current target temperature signal and the prescribed temperature signal to determine whether or not the current target temperature resides within the prescribed temperature range.

In cases where very hot water is being supplied via the bathtub nozzle 63 and thus the target temperature resides outside the prescribed temperature range, when the tap/shower switch 76 is depressed into its ON position, the judgment section 54 activates a given temperature section 53 and a timer 55. After the tap/shower switch 76 is depressed into its ON position, the timer 55 controls the direction judgment section 49B so that the water supply via the bathtub nozzle 63 further continues for a predetermined interval given by the timer 55. During this additional water supply via the bathtub nozzle 63, the given temperature section 53 outputs a signal representative of a given target temperature, for example, 40° C., to the subtracter 48A so that the feedback temperature control moves the temperature of the supplied water to the given target temperature. The interval determined by the timer 55 is chosen to be a time in which the supplied water temperature surely moves to the given target temperature. When this predetermined interval elapses, the direction judgment section 49B forces the change-over valve 56 to select the first outlet 57 of the mixing unit 19 so that the water having the given target temperature starts to be supplied via the tap 60 and the shower nozzle 59. In this way, after the supplied water temperature moves to the given target temperature, the water supply via the bathtub nozzle 63 is suspended and the water supply via the tap 60 and the shower nozzle 59 is started. This process prevents the supply of excessively hot or cold water via the tap 60 and the shower nozzle 59 upon a change of active one of the outlets 57 and 58 of the mixing unit 19.

In cases where water is being supplied via the bathtub nozzle 63 and the target temperature resides within the prescribed temperature range, when the tap/shower switch 76 is depressed into its ON position, the judgment section 54 does not activate the given temperature section 53 and the timer 55 so that the change-over valve 56 immediately selects the first outlet 57 and thus the water supply via the tap 60 and the shower nozzle 59 starts promptly.

In cases where the target temperature resides outside the prescribed temperature range, when the tap/shower switch 76 or the bathtub switch 77 is moved from its ON position to its OFF position, the judgment section 54 activates the given temperature section 53 and the timer 55. After the tap/shower switch 76 or the bath tub switch 77 is moved to its OFF position, the timer 55 keeps the adjustment section 49 activated for a predetermined interval so that the water supply continues for that interval. During this additional water supply, the given temperature section 53 outputs a signal representative of a given target temperature, for example, 40° C., to the subtracter 48A so that the feedback temperature control moves the temperature of the supplied water to the given target temperature. The interval determined by the timer 55 is chosen to be a time in which the supplied water temperature surely moves to the given target temperature. Accordingly, after the supplied water temperature moves to the given target temperature, the water supply is suspended. This process prevents the supply of excessively hot or cold water upon a restart of water supply. In cases where the target temperature resides within the prescribed temperature range, when the tap/shower switch 76 or the bathtub switch 77 is moved to its OFF position, the judgment section 54 controls the adjustment section 49 and thereby allows the change-over valve 56 to block both of the outlets 57 and 58 of the mixing unit 19 so that the water supply is interrupted immediately.

Operation of the hot water supply system will be further described. When the tap/shower switch 76 of the main setting unit 66 is depressed into its ON position, the change-over valve 56 selects the first outlet 57 of the mixing unit 19 so that the water mixture is supplied to the tap 60 and the shower nozzle 59. The temperature and the flow rate of the water mixture are regulated at respective target values preset via the control circuit 31. In the temperature regulation control, the mixing valve 23 adjusts the mixing ratio between the hot water and the cold water so that the actual water mixture temperature detected via the thermistor 24 can be equal to the target water mixture temperature. In the flow rate regulation control, the change-over valve 56 adjusts the flow rate of the supplied water mixture so that the actual flow rate detected via the flow rate sensor 25 can be equal to the target flow rate. The target temperature of supplied water mixture can be varied by actuating the temperature control switches 43 and 44.

In cases where the first outlet 57 is selected by depressing the tap/shower switch 76, the target temperature of supplied water mixture is limited to a range below 45° C. The target flow rate of supplied water mixture can be varied by actuating the flow rate control switches 45 and 46. Movement of the tap/shower switch 76 into its OFF position allows the change-over valve 56 to suspend the supply of the water mixture. It is preferable that, when the actual quantity of the supplied water mixture, which is detected by the combination of the flow rate sensor 25 and the flow rate accumulator 90, reaches a setting quantity given via the variable resistor 78, further supply of the water mixture is suspended by moving the change-over valve 56.

When the bathtub switch 77 of the setting unit 66 is depressed into its ON position, the change-over valve 56 selects the second outlet 58 of the mixing unit 19 so that the water mixture is supplied to the bathtub nozzle 63. The temperature and the flow rate of the water mixture are regulated at respective target values preset via the control circuit 31. In the case of the supply of hot water into the bathtub 62, when the actual quantity of the supplied water mixture, which is detected by the combination of the flow rate sensor 25 and the flow rate accumulator 90, reaches a setting quantity given via the variable resistor 78, further supply of the water mixture is suspended by moving the change-over valve 56.

When an increase in the temperature of water within the bathtub 62 is required, the bathtub switch 77 is depressed into its ON position and then the temperature increasing switch 43 is actuated so that hottest water is usually supplied into the bathtub 62 via the bathtub nozzle 63.

During or after the supply of hot water into the bathtub 63, when the tap/shower switch 76 is depressed into its ON position, the mixing valve 22 is moved to a position corresponding to a preset temperature, for example, 42° C., and then the change-over valve 56 selects the first outlet 57 of the mixing unit 19 so that the water mixture of the preset temperature starts to be supplied to the tap 60 and the shower nozzle 59.

As described previously, the water temperature is lowered to the given temperature upon the suspension of very hot water supply via the bathtub nozzle 63. Accordingly, during a time immediately after very hot water was supplied into the bathtub 62, when warm or appropriately hot water is required to be supplied via the tap 60 and the shower nozzle 59, the supply of excessively hot water via the tap 60 and the shower nozzle 59 is prevented. In addition, during the very hot water supply via the bathtub nozzle 63, since the change-over valve 56 blocks the first outlet 57 of the mixing unit 19, the very hot water supplied toward the bathtub nozzle 63 is prevented from moving to the tap 60 and the shower nozzle 59. The temperature safety valve 65 prevents the supply of excessively hot water via the first outlet 57 of the mixing unit 19 which could occur in the case of a malfunction of the mixing valve 23, the change-over valve 56, or the control circuit 31. The temperature safety valve 65 is activated at a preset temperature, for example, 46° C.

In cases where the tap/shower switch 76 is depressed into its ON position, when the water mixture temperature detected via the thermistor 24 is lower than a target temperature preset via the control circuit 31, the change-over valve 56 is controlled to disable the first outlet 57 but enable the second outlet 58 of the mixing unit 19. Accordingly, the low temperature water mixture escapes into the bathtub 62 and is prevented from discharging via the tap 60 and the shower nozzle 59. In these cases, after the detected water mixture temperature reaches the target temperature, the change-over valve 56 is moved to allow the supply of water mixture via the tap 60 and the shower nozzle 59.

The temperature of water supplied via the first outlet 57 of the mixing unit 19 and the temperature of water supplied via the second outlet 58 of the mixing unit 19 reside in respective different ranges. Accordingly, the temperature of supplied water is changed automatically in accordance with which of the first outlet 57 and the second outlet 58 is selected, that is, which of the tap/shower switch 76 and the bathtub switch 77 is depressed into its ON position. This allows an improved safety and an easy handling of the hot water supply system.

DESCRIPTION OF THE FOURTH PREFERRED EMBODIMENT

Figure 12:
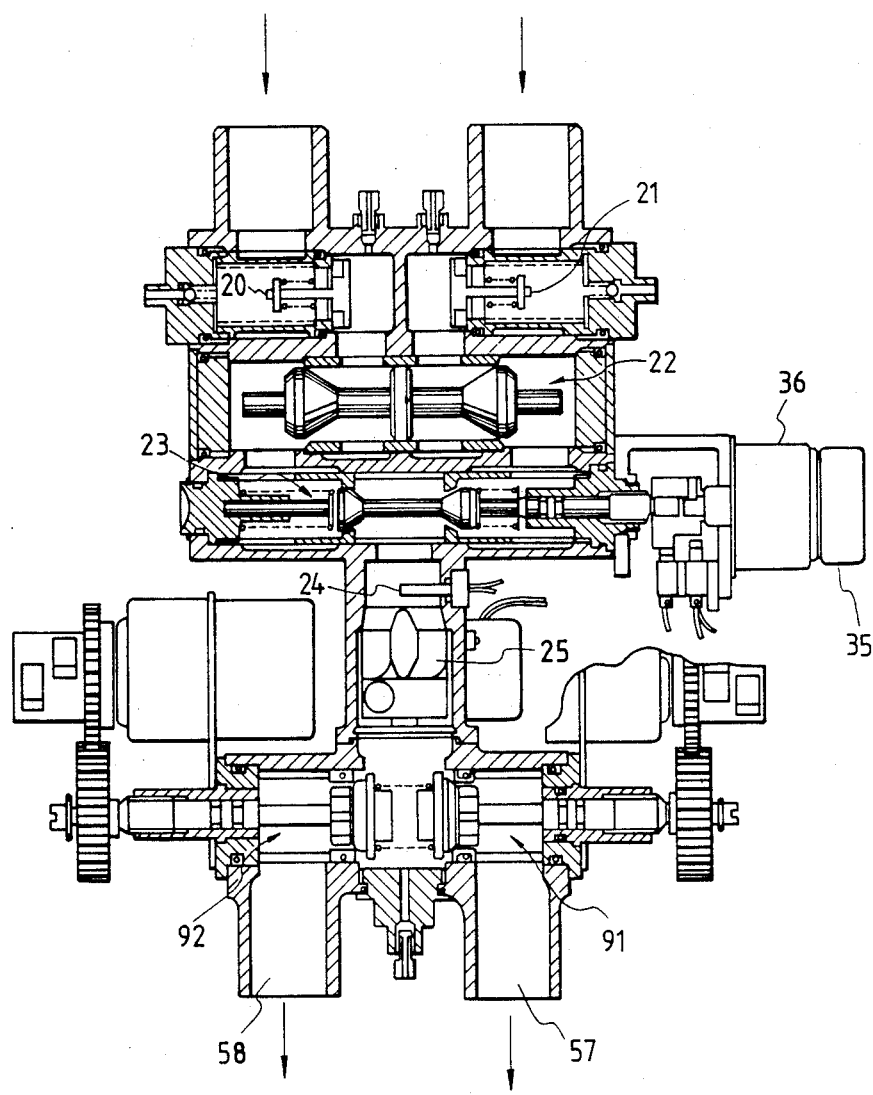
FIG. 12 is a sectional view of a portion of a hot water supply system according to a fourth embodiment of this invention.
Figure 13:
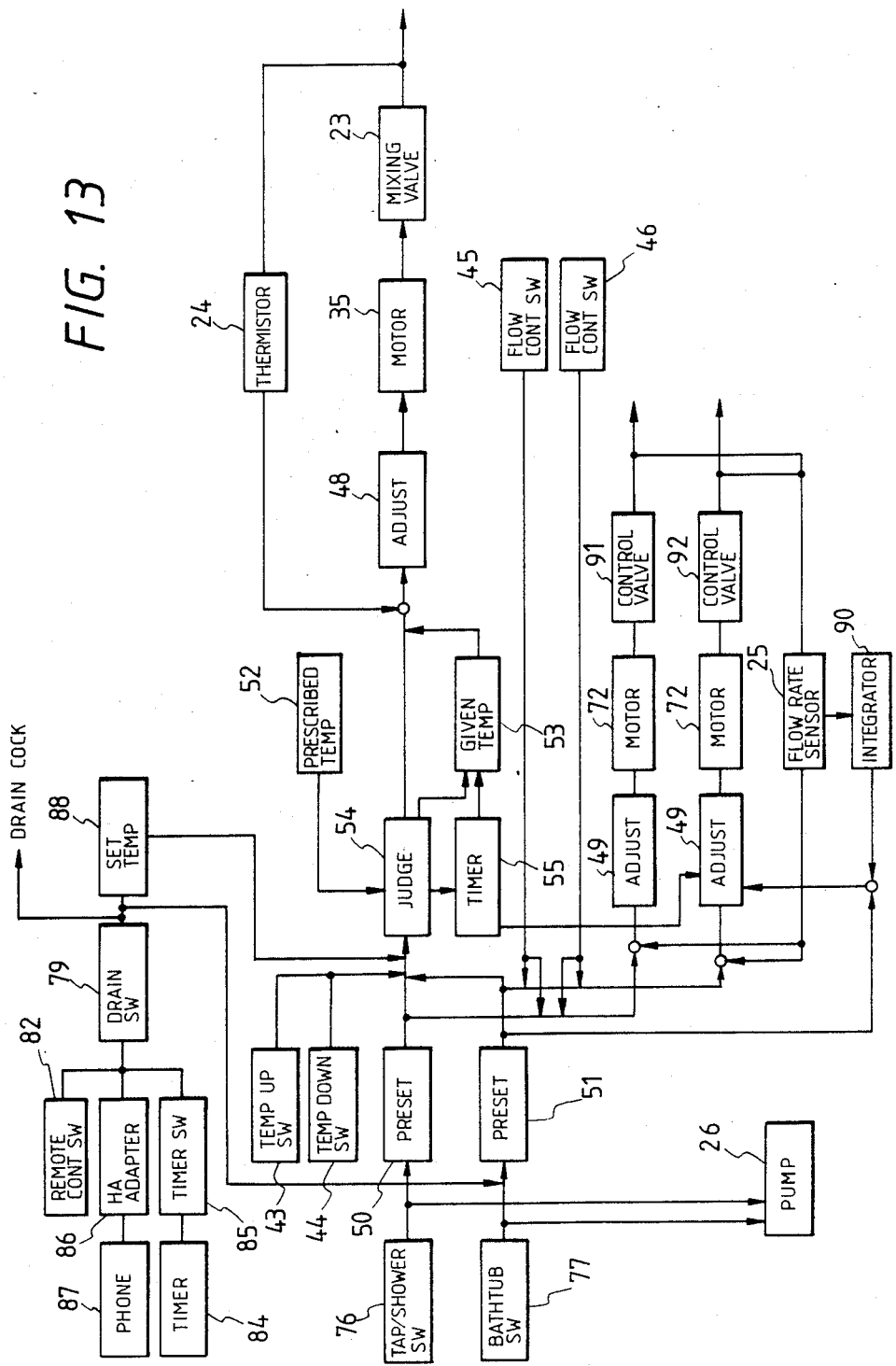
FIG. 13 is a diagram of the hot water supply system of FIG. 12.

FIGS. 12 and 13 show a fourth embodiment of this invention which is similar to the embodiment of FIGS. 7-11 except for design changes indicated hereinafter.

As shown in FIG. 12, the first outlet 57 and the second outlet 58 are formed at regions downstream of the mixing valve 23. Control valves 91 and 92 are provided corresponding to the first and second outlets 57 and 58 respectively. The control valves 91 and 92 independently control water flows in the first and second outlets 57 and 58. Each of the control valves 91 and 92 can allow and inhibit the related water flow and also can adjust the rate of the related water flow. The water supply via the first outlet 57 and the water supply via the second outlet 58 can be enabled simultaneously. The control valves 91 and 92 are of an electrically-driven type, such as motor-driven valves or solenoid valves.

As shown in FIG. 13, in the case where the water having a temperature outside the prescribed range is being supplied, when the water supply is required to be suspended or when the selected outlet is required to be changed, the control valves 91 and 92 are adjusted to allow and suspend the water supply. In the case where the water supplies via the outlets 57 and 58 are performed simultaneously, for example, in the case where the water having a temperature above the prescribed range remains supplied via the first outlet 57 and the supply of water via the second outlet 58 is required, the mixing valve 23 is automatically controlled and the temperature is returned to the given temperature and then the control valve 92 is controlled to unblock the passage 64. Accordingly, in the case where one of the outlets 57 and 58 keeps the supply of water having a temperature outside the prescribed range and the other outlet is required to start the supply of water having the prescribed temperature, the mixing valve 23 is controlled and the temperature is returned to the given point and then the corresponding control valve 91 or 92 is opened. In the case where the water supplies via the outlets 57 and 58 are performed simultaneously and the setting temperatures are different for the outlets 57 and 58, the mixing valve 23 is controlled in correspondence with the lower setting temperature outlet.

DESCRIPTION OF THE FIFTH PREFERRED EMBODIMENT

Figure 14:
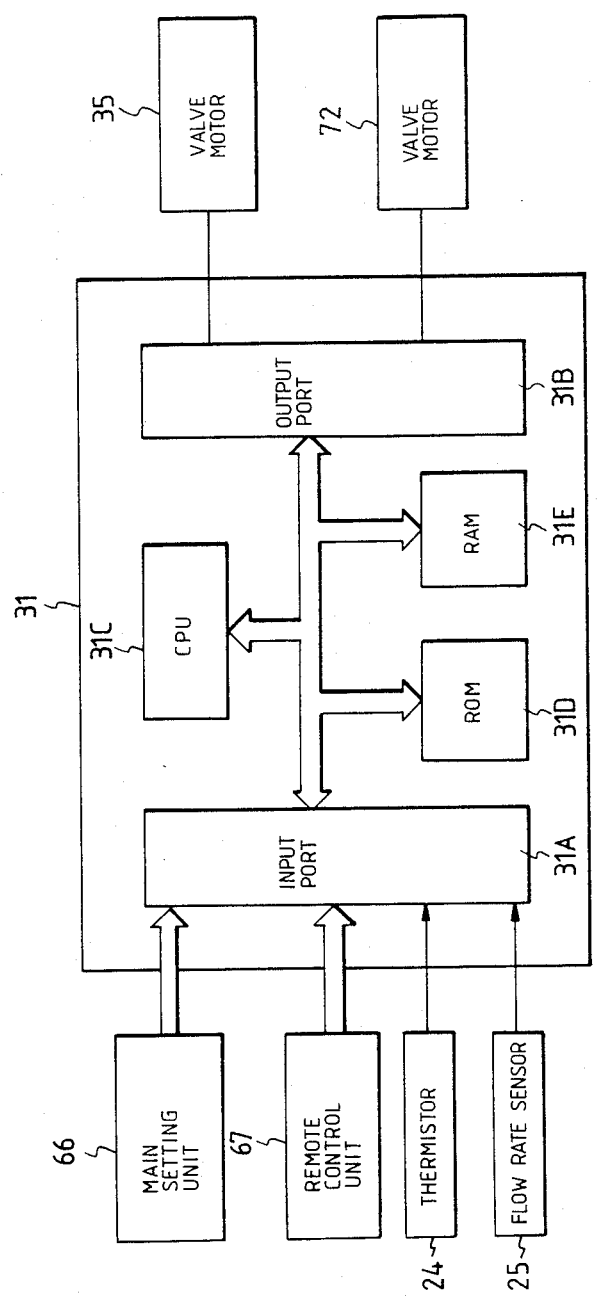
FIG. 14 is a block diagram of a portion of a hot water supply system according to a fifth embodiment of this invention.

FIG. 14 shows a fifth embodiment of this invention which is similar to the embodiment of FIGS. 7-11 except for design changes indicated hereinafter.

As shown in FIG. 14, the control circuit 31 includes a microcomputer having a combination of an input port 31A, an output port 31B, a central processing unit (CPU) 31C, a read-only memory (ROM) 31D, and a random-access memory (RAM) 31E. The input port 31A receives output signals from the main setting unit 66, the remote control setting unit 67, the thermistor 24, and the flow rate sensor 25. The input port 31A includes analog-to-digital converters which change the received analog signals into corresponding digital signals. The output port 31B feeds control signals to the valve motors 35 and 72. The output port 31B includes digital-to-analog converters which change digital signals into corresponding analog signals. The output port 31B also includes drivers for the valve motors 35 and 72.

Figure 15:
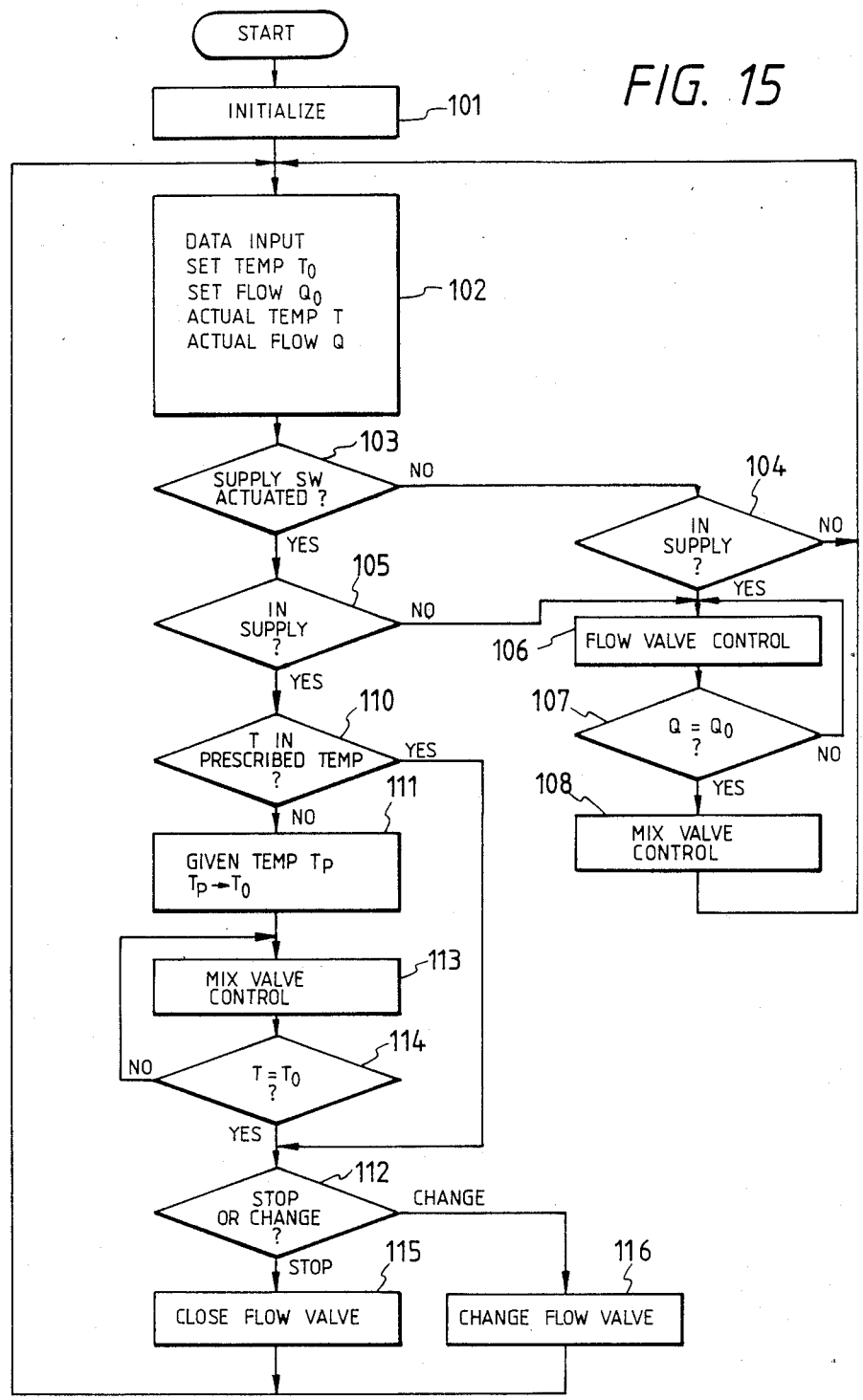
FIG. 15 is a flowchart of a program operating the control circuit of FIG. 14.

The control circuit 31 operates in accordance with a program stored in the ROM 31D. FIG. 15 is a flowchart of the program. When a main power supply switch (not shown) is turned to its ON position, the program starts.

As shown in FIG. 15, a first block 101 of the program initializes variables used in subsequent steps o blocks of the program. After the block 101, the program advances to a block 102.

The block 102 inputs various data. For example, a setting or target water temperature To and a setting or target water flow rate Qo are initially given by preset values stored in the ROM 31D. The setting water temperature To and the setting water flow rate Qo can be changed in accordance with the output signals from the temperature control switches and volumes within the main setting unit 66 and the remote control setting unit 67. The actual water temperature T is derived from the output signal of the thermistor 24. The actual water flow rate Q is derived from the output signal of the flow rate sensor 25.

A block 103 subsequent to the block 102 determines whether or not one of the tap/shower switch 76 (see FIGS. 9 and 11) and the bathtub switch 77 (see FIGS. 9 and 11) is being actuated by referring to the output signal from the main setting unit 66. When neither of the switches 76 and 77 is being actuated, the program advances to a block 104. When one of the switches 76 and 77 is being actuated, the program advances to a block 105.

The block 104 determines whether or not water supply is being performed. For example, this determination is executed by referring to the present state of the control signal to the change-over valve drive motor 72. When the water supply is not being performed, the program returns to the block 102. Accordingly, while neither of the switches 76 and 77 remains actuated and the water supply remains at rest, the blocks 102-104 are repeatedly executed. When the water supply is being performed, the program advances from the block 104 to a block 106.

The block 106 controls the change-over valve 56 (see FIGS. 7 and 11) via the motor 72 in accordance with a difference between the setting water flow rate Qo and the actual water flow rate Q in order to move the change-over valve 56 in the direction of decreasing the flow rate difference.

A block 107 following the block 106 compares the actual water flow rate Q and the setting water flow rate Qo. When the actual water flow rate Q differs from the setting water flow rate Qo, the program returns to the block 106. Accordingly, the blocks 106 and 107 are reiterated until the actual water flow rate Q equals the setting water flow rate Qo. When the actual water flow rate Q equals the setting water flow rate Qo, the program advances from the block 107 to a block 108.

The block 108 controls the mixing valve 23 (see FIGS. 7 and 11) via the motor 35 in accordance with a difference between the setting water temperature To and the actual water temperature T in order to move the mixing valve 23 in the direction of decreasing the temperature difference. After the block 108, the program returns to the block 102.

Accordingly, while the water supply remains without the actuation of the switches 76 and 77, the water supply rate is regulated by the execution of the blocks 106 and 107 and the water temperature is regulated by the execution of the block 108.

The block 105 determines whether or not water supply is being performed as in the block 104. When the water supply is not being performed, the program advances to the block 106. Accordingly, when one of the switches 76 and 77 is actuated during the suspension of the water supply, the program advances to the block 106 via the blocks 103 and 105 so that the water supply is started and the flow rate control and the temperature control are performed. When the water supply is being performed, the program advances from the block 105 to a block 110.

The block 110 determines whether or not the actual water temperature T resides within a prescribed range, for example, a range of 38°-45° C. When the actual water temperature T resides outside the prescribed range, the program advances to a block 111. When the actual water temperature T resides within the perscribed range, the program jumps to a block 112.

The block 111 sets the setting water temperature To equal to a given water temperature $T_p$, for example, 40° C. After the block 111, the program advances to a block 113.

The block 113 controls the mixing valve 23 (see FIGS. 7 and 11) via the motor 35 in accordance with a difference between the setting water temperature To and the actual water temperature T in order to move the mixing valve 23 in the direction of decreasing the temperature difference.

A block 114 following the block 113 compares the actual water temperature T and the setting water temperature To. When the actual water temperature T differs from the setting water temperature To, the program returns to the block 113. Accordingly, the blocks 113 and 114 are reiterated until the actual water temperature T equals the setting water temperature To. When the actual water temperature T equals the setting water temperature To, the program advances from the block 114 to the block 112.

The block 112 determines whether the suspension of the water supply or the change of active one of the outlets 57 and 58 (see FIG. 7) is required by the present actuation of the switches 76 and 77. Specifically, when the precedingly actuated switch equals the currently actuated switch, the block 112 detects that the suspension of the water supply is required. In this case, the program advances to a block 115. When the precedingly actuated switch differs from the currently actuated switch, the block 112 detects that the change of active one of the outlets 57 and 58 is required. In this case, the program advances to a block 116.

The block 115 controls the change-over valve 56 via the motor 72 so that the change-over valve 56 blocks both of the outlets 57 and 58 (see FIG. 7) to suspend the water supply. After the block 115, the program returns to the block 102.

The block 116 controls the change-over valve 56 via the motor 72 so that the change-over valve 56 changes the active outlet. Accordingly, the water supply via one of the outlets 57 and 58 (see FIG. 7) is changed by the water supply via the other outlet. After the block 115, the program returns to the block 102.

In cases where the suspension of the water supply or the change of active one of the outlets 57 and 58 (see FIG. 7) is required, when the actual water temperature resides outside the prescribed range, the blocks 111–116 move the actual temperature to the given temperature and then realize the suspension of the water supply or the change of active one of the outlets 57 and 58.

What is claimed is:

1. A hot water supply system, comprising:
    (a) a temperature adjusting means for adjusting a temperature of water;
    (b) a control valve allowing and inhibiting supply of the temperature adjusted water;
    (c) a temperature setting means for setting a target temperature value for the water temperature adjusted by the temperature adjusting means;
    (d) a supply setting means for instructing allowance and inhibition of the water supply by the control valve; and
    (e) a control means for controlling the temperature adjusting means and the control valve in accordance with an output signal from the supply setting means, the control means being operative, in cases where the supply setting means instructs the inhibition of the water supply and where the supplied water temperature resides outside a prescribed range, to change the supplied water temperature to a given temperature before performing a control for the inhibition of the water supply.

2. The hot water supply system of claim 1, wherein: in cases where the supply setting means instructs the inhibition of the water supply and where the supplied water temperature resides outside the prescribed range, the control means is operative to change the target temperature, which was set by the temperature setting means, to the given temperature, and to control the temperature adjusting means and then inhibit the water supply.

3. The hot water supply system of claim 1, wherein: the temperature adjusting means comprises a temperature detector, and wherein, in cases where the supply setting means instructs the inhibition of the water supply and where the supplied water temperature resides outside the prescribed range, the control means is operative to control the temperature adjusting means to vary the water temperature and is operative to control the control valve to inhibit the water supply after a signal of the temperature detector corresponds to detection of said given temperature.

4. The hot water supply system of claim 1, wherein: the temperature adjusting means comprises an electrically controllable valve means for mixing hot water and cold water.

5. The hot water supply system of claim 1, wherein: the control means is operative, after the water temperature is changed to the given temperature, to keep the water supply for a predetermined interval and then perform the control of the control valve.

6. A hot water supply system, comprising:
    (a) a temperature adjusting means for adjusting a temperature of water;
    (b) a change-over valve selectively supplying the temperature adjusted water to one of a plurality of positions;
    (c) a temperature setting means for setting the water temperature adjusted by the temperature adjusting means;
    (d) a change setting means for instructing change of the water supplied positions to which water is supplied by the change-over valve; and
    (e) a control means for controlling the temperature adjusting means and the change-over valve in accordance with an output signal from the change setting means, the control means being operative, in cases where the change setting means instructs the change of the water supplied positions and where the supplied water temperature resides outside a prescribed range, to change the supplied water temperature to a given temperature before performing a change of the water supplied positions.

7. The hot water supply system of claim 6, wherein; in cases where the change setting means instructs the change of the water supplied positions and where the supplied water temperature resides outside the prescribed range, the control means is operative to change the setting temperature, which was set by the temperature setting means, to the given temperature, and to control the temperature adjusting means and then control the change-over valve to change the water supplied positions.

8. The hot water supply system of claim 6, wherein; the temperature adjusting means comprises a temperature detector, and wherein, in cases where the change setting means instructs the change of the water supplied positions and where the supplied water temperature resides outside the prescribed range, the control means is operative to control the temperature adjusting means to vary the water temperature and is operative to control the change-over valve to change the water supplied positions after a signal of the temperature detector reaches a given temperature.

9. The hot water supply system of claim 6, wherein;
the temperature adjusting means comprises an electrically controllable valve mixing hot water and cold water.

10. The hot water supply system of claim 6, wherein:
the control means is operative to keep the water supply for a predetermined interval after the water temperature is changed to the given temperature and to then perform the control of the change-over valve.

11. A hot water supply system, comprising:
(a) a temperature adjusting means for adjusting a temperature of water;
(b) a plurality of control valves allowing and inhibiting supply of the temperature adjusted water to a plurality of positions;
(c) a temperature setting means for setting a water temperature adjusted by the temperature adjusting means;
(d) a selection setting means for selecting at least one of the water supplied positions; and
(e) a control means for controlling the temperature adjusting means and the control valves in accordance with an output signal from the selection setting means, the control means being operative to remove the supplied water temperature to a given temperature and then perform the water supply to said given one of the water supplied positions in circumstances where the selection setting means instructs the water supply to given one of the water supplied positions and where the supplied water temperature resides outside a prescribed range.

12. The hot water supply system of claim 11 wherein, in cases where the selection setting means instructs the water supply to said given one of the water supplied positions and where the supplied water temperature resides outside the prescribed range, the control means is operative to change the setting temperature, which was set by the temperature setting means, to the given temperature, and to control the temperature adjusting means and then perform the water supply to said give one of the water supplied positions.

13. The hot water supply system of claim 11, wherein;
the temperature adjusting means comprises a temperature detector, and wherein, in cases where the selection setting means instructs the water supply to said given one of the water supplied positions and where the supplied water temperature resides outside the prescribed range, the control means is operative to control the temperature adjusting means to vary the water temperature and is operative to control the control valves to perform the water supply to said given one of the water supplied positions after a signal of the temperature detector reaches a given temperature.

14. The hot water supply system of claim 11, wherein;
the temperature adjusting means comprises an electrically controllable valve mixing hot water and cold water.

15. The hot water supply system of claim 11, wherein;
the control means is operative to, after the water temperature is moved to the given temperature, keep the water supply for a predetermined interval and then perform the control of the control valves.

16. The hot water supply system of claim 11, wherein;
the control of the control valves by the control means allows the water supply to two or more of the water supplied positions simultaneously.

17. A hot water supply system, comprising:
(a) means for detecting when a water supply is required to be stopped;
(b) means for changing a temperature of supplied water to a given temperature when a requirement for stopping of the water supply is detected; and
(c) means for stopping the water supply after the temperature of the supplied water changes to the given temperature.

18. A hot water supply system, comprising:
(a) a plurality of outlets;
(b) means for selecting one of the outlets and directing water toward the selected outlet;
(c) means for detecting when the selected outlet is required to be changed to another of the outlets;
(d) means for changing a temperature of the water to a given temperature when a requirement for a change of the selected outlet is detected; and
(e) means for changing the selected outlet to another of the outlets after the water temperature changes to the given temperature.

* * * * *